United States Patent [19]

Smith et al.

[11] Patent Number: 4,859,935
[45] Date of Patent: Aug. 22, 1989

[54] METHOD AND APPARATUS FOR COMBINING AN OPTICAL AND ELECTRICAL CHANNEL IN AN OSCILLOSCOPE

[75] Inventors: Kevin K. Smith, West Linn, Oreg.; Bryan E. Allsop, Watton-Atstone, England

[73] Assignee: Tektronix, Inc., Beaverton, Oreg.

[21] Appl. No.: 263,147

[22] Filed: Oct. 27, 1988

[51] Int. Cl.[4] .......................... G01R 35/00; H03H 7/24
[52] U.S. Cl. ............................ 324/121 R; 324/115; 333/81 R
[58] Field of Search ................... 324/121 R, 115; 340/715, 720, 721, 722; 307/540, 243, 311; 328/104, 154; 333/81 R, 81 A; 364/487, 571.01

[56] References Cited

U.S. PATENT DOCUMENTS

| | | | |
|---|---|---|---|
| 4,553,091 | 11/1985 | Bristol | 324/115 |
| 4,654,610 | 3/1987 | DaSilva | 333/81 R |
| 4,806,888 | 2/1989 | Savage et al. | 333/81 R |

Primary Examiner—Reinhard J. Eisenzopf
Assistant Examiner—Vinh P. Nguyen
Attorney, Agent, or Firm—Peter J. Meza

[57] ABSTRACT

A combined electrical and optical channel for use in an oscilloscope is provided in which the vertical deflection factor is set by a single input attenutation selector switch. The electical input is passed through an attenuator. The optical input is passed through an input transimpedance amplifier having at least two gain modes and an attenuator. The output from the input attenuation selector switch is encoded to form a digital output. The attenuators for the electrical channel are driven directly by the input attenuation selector switch or by the digital output corresponding to the setting of the input attenuation selector switch. The digital output is also decoded by a logic block to generate a gain mode logic signal to switch the gain modes of the input transimpedance amplifier. In addition, the logic block generates a logic signal to select an appropriate attenuation factor for the optical channel according to the setting of the input attenuation selector switch and the gain mode of the input transimpedance amplifier. The attenuated voltage output of each channel is selectively switched and passed to a common vertical amplifier section in the oscilloscope.

8 Claims, 1 Drawing Sheet

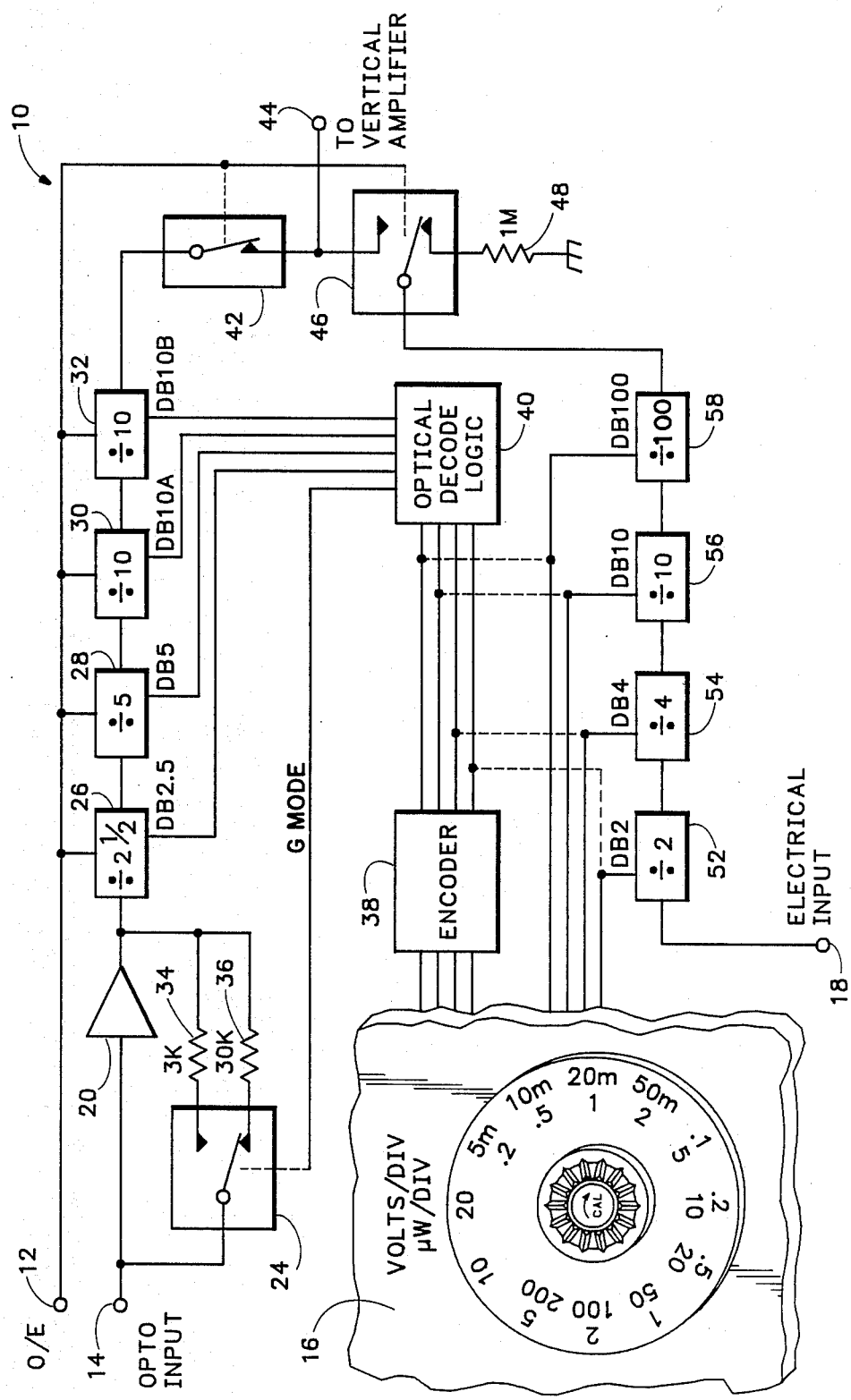

METHOD AND APPARATUS FOR COMBINING AN OPTICAL AND ELECTRICAL CHANNEL IN AN OSCILLOSCOPE

BACKGROUND OF THE INVENTION

This invention relates to combining optical channels and electrical channels in an oscilloscope. More particularly, the invention relates to combining the channels in a manner which enables the vertical deflection factor to be set for each channel with a single input attenuation selector switch.

Oscilloscopes contain an input attenuation selector switch which controls an attenuator section in series with the voltage input. In order to maintain a usable signal, the attenuation factor must be increased as the magnitude of the input voltage increases. A typical progression of attenuation on an oscilloscope is 1, 2, 4, 10, 20, 40, etc.

Typical optical receivers have a photodiode, a transimpedance amplifier, and one feedback resistor which results in limited dynamic range. One manner of improving the dynamic range is to include two or more feedback resistors to change the closed loop transimpedance. The feedback resistors are usually in parallel and are selectively switched into the circuit depending on the magnitude of the input photocurrent. Integrating the output of the optical receiver into an oscilloscope, however, would result in a deflection factor which is not constant. Due to varying gain modes, the output voltage of the optical receiver could not be directly used by the vertical amplifier of an oscilloscope. For example, if the optical receiver had gain modes of 3K ohms and 30K ohms, the vertical deflection could be 5 mV per division and 50 mV per division, respectively, depending upon the magnitude of the input photosignal.

What is desired is a method and apparatus for combining an optical channel and an electrical channel such that the voltage output of each channel is passed through a common vertical amplifier section and the vertical deflection factor is set by a single input attenuation selector switch.

SUMMARY OF THE INVENTION

In accordance with the present invention, an oscilloscope contains an electrical channel and an optical channel in which the vertical deflection factor is set by a single input attenuation selector switch. The electrical input is passed through an attenuator. The optical input is passed through an input transimpedance amplifier having at least two gain modes and an attenuator. The output from the input attenuation selector switch is encoded to form a digital output. This output or the direct output of the selector switch selects an attenuation factor for the electrical channel corresponding to the setting of the input attenuation selector switch. The digital output is also decoded by a logic block to generate a gain mode logic signal to switch the gain modes of the input transimpedance amplifier. In addition, the logic block generates a logic signal to select an appropriate attenuation factor for the optical channel according to the setting of the input attenuation selector switch and the gain mode of the input transimpedance amplifier. The attenuated voltage output of each channel is selectively switched and passed to a common vertical amplifier section.

BRIEF DESCRIPTION OF THE DRAWING

For a better understanding of the invention, and to show how the same may be carried into effect, reference will now be made to the accompanying drawing, in which:

The SOLE FIGURE is a schematic diagram of a combined electrical and optical channel in accordance with the present invention.

DESCRIPTION OF THE PREFERRED EMBODIMENT

A combined electrical and optical channel 10 is shown in the SOLE FIGURE as having an optical current input terminal 14 and an electrical voltage input terminal 18. The voltage at terminal 18 is passed through attenuators 52, 54, 56, and 58. As shown, attenuator 52 has an attenuation factor of two and may be disengaged with a digital input signal DB2. Similarly, attenuators 54, 56, and 58 have attenuation factors of four, ten, and one hundred, and may be selectively disengaged with digital input signals DB4, DB10, and DB100, respectively. In the preferred embodiment, input attenuator switch 16 is used to directly drive the attenuators in the electrical path. The output of input attenuation selector switch 16 is then encoded by encoder 38 to form a digital word. The exact nature of the logic function and digital circuitry of encoder 38 depends upon the nature of the input attenuator selector switch. Depending upon the nature of selector switch 16, or if desired, the digital word may be used to select appropriate attenuator sections 52, 54, 56, and 58 in accordance with the setting of the input selector switch 16. The outputs of the encoder 38 being used to drive the attenuators are shown as dashed lines in the SOLE FIGURE. The voltage at the output of attenuator 58 is coupled to the vertical amplifier section through terminal 44.

The optical channel current input is shown in the SOLE FIGURE at terminal 14. The current at terminal 14 is transformed into an output voltage by an input transimpedance amplifier consisting of operational amplifier 20, feedback resistors 34 and 36, and switch 24. A transimpedance of 3K ohms or 30K ohms is selected by a digital input to switch 24. The output of the transimpedance amplifier is passed to attenuators 26, 28, 30, and 32. As shown, attenuator 26 has an attenuation factor of 2.5 and may be disengaged with a digital input signal DB2.5. Similarly, attenuators 28, 30, and 32 have attenuation factors of five, ten, and ten, and may be selectively disengaged with digital input signals DB5, DB10A, and DB10B, respectively. The digital word generated by encoder 38 is decoded by logic block 40. The logic block generates a gain mode signal labeled GMODE which selects either feedback resistor 34 or 36 depending upon the magnitude of the input photocurrent. Additionally, the logic block 40 generates a digital word which selects appropriate attenuator sections in accordance with the setting of the input selector switch and the gain mode of the input transimpedance amplifier. The voltage at the output of attenuator 32 is coupled to the vertical amplifier section through terminal 44.

The design of logic block 40 enables the single input attenuator selector switch to control the attenuation of the optical channel. The following table is constructed by determining the attenuation factors from one setting to the next to achieve constant electrical output sensitivity (e.g., 5 mV/Div) for both the electrical and optical channels. It is useful for understanding the nature and design constraints of logic block 40. The settings for the input attenuator selector switch are listed in Volts per Division ("Volts/D") for the electrical channel, and Watts per Division ("Watts/D") for the optical channel. An "X" denotes that an attenuator is being used in the circuit. RF designates the value of feedback resistor being used in the input transimpedance amplifier.

| Electrical | | | | | Optical | | | | | |
|---|---|---|---|---|---|---|---|---|---|---|
| Volts/D | ÷2 | ÷4 | ÷10 | ÷100 | Watts/D | ÷2.5 | ÷5 | ÷10B | ÷10A | RF |
| 5 m | | | | | 200 n | | | | | 30K |
| 10 m | X | | | | 500 n | X | | | | 30K |
| 20 m | | X | | | 1 u | | X | | | 30K |
| 50 m | | | X | | 2 u | | | X | | 30K |
| 100 m | X | | X | | 5 u | X | | X | | 30K |
| 200 m | | X | X | | 10 u | | X | X | | 30K |
| 500 m | | | | X | 20 u | | | X | | 3K |
| 1 | X | | | X | 50 u | X | | X | | 3K |
| 2 | | X | | X | 100 u | | X | X | | 3K |
| 5 | | | X | X | 200 u | | | X | X | 3K |

Therefore, logic block 40 is designed such that the attenuation factors for the electrical and optical channels increase by the desired ratios. Digital signals DB2, DB4, DB10, and DB100 are the inputs, and DB2.5, DB5, DB10A, DB10B, and GMODE are the outputs. From the preceding table, it is evident that the design of the logic block 40 is based upon the following equations:

DB2.5=DB2
DB5=DB4
DB10A=DB10·DB100
DB10B=DB10+DB100
GMODE=DB100

Once the appropriate voltages have been developed at the output of attenuators 32 and 58, they must be selected to form a single combined output to be received by the vertical amplifier section at terminal 44. A digital input signal O/E at terminal 12 is used to determine whether the optical signal or the electrical signal will be passed to the vertical amplifier section. In the electrical mode, digital signal O/E engages attenuators 26, 28, 30, and 32 in order that a maximum attenuation is achieved in the optical channel. The O/E input is received by a second logic input to the attenuators and engages the attenuators without regard to the value of digital signals DB2.5, DB5, DB10A, and DB10B. Maximum attenuation is desired to minimize crosstalk between the electrical and optical channels. Digital signal O/E is also used to open switch 42, and to change the polarity of switch 46, in order that the optical signal is disconnected and that the electrical signal is connected to terminal 44. In the optical mode, digital signal O/E closes switch 42, and changes the polarity of switch 46, in order that the electrical signal is shorted to ground through 1 MEG ohm resistor 48 and crosstalk is reduced, and that the optical signal is routed to terminal 44.

It will be appreciated that the present invention is not restricted to the particular embodiment that has been described, and that variations may be made therein without departing from the scope of the invention as defined in the appended claims and equivalents thereof. For example, the attenuators for the electrical and optical channel may be more or less than four in number, and may be of any conventional Pi or T configuration. The transimpedance amplifier in the optical channel may have more than two gain modes selectable by switch 24. However, these other embodiments will necessitate a different logic function for logic block 40. The design of the logic block will be determined by the analysis of a table showing the attenuation factors in a manner similar to that which is described herein.

I claim:

1. An apparatus for combining an electrical and an optical channel in an oscilloscope comprising:

(a) first means for attenuating a first analog input signal having a selectable attenuation factor to produce a first analog output signal;
(b) second means for attenuating a second analog input signal to produce a second analog output signal;
(c) means for converting a photocurrent to the second analog input signal;
(d) means for encoding the selectable attenuation factor into a first digital signal;
(e) means for decoding the first digital signal to produce a second digital signal for selecting an attenuation factor for the second attenuating means; and
(f) means for selectively coupling to an output terminal the first analog output signal and the second analog output signal.

2. An apparatus for combining an electrical and an optical channel in an oscilloscope as in claim 1 wherein said means for converting a photocurrent includes a plurality of gain modes selectable by a digital gain mode signal and said means for decoding the first digital signal further produces the digital gain mode signal.

3. An apparatus for combining an electrical and an optical channel in an oscilloscope as in claim 2 wherein said means for converting comprises an operational amplifier having an input and an output, a plurality of feedback resistors coupled to the output of the operational amplifier in parallel relation, and a switch coupled to the input of the operational amplifier for selectively coupling one of said feedback resistors to the input of the operational amplifier, the switch setting being determined by the digital gain mode signal.

4. An apparatus for combining an electrical and an optical channel in an oscilloscope as in claim 1 wherein said first means for attenuating comprises a plurality of single attenuator sections in series relation each having an analog input, an analog output, and a digital input for selectively engaging the attenuator section.

5. An apparatus for combining an electrical and an optical channel in an oscilloscope as in claim 1 wherein said second means for attenuating comprises a plurality of single attenuator sections in series relation each having an analog input, an analog output, and a first digital input for selectively engaging the attenuator section.

6. An apparatus for combining an electrical and an optical channel in an oscilloscope as in claim 5 wherein each of the single attenuator sections further comprise a second digital input for selectively engaging the attenuator section without regard to the value of the first digital input.

7. An apparatus for combining an electrical and an optical channel in an oscilloscope as in claim 1 wherein said means for selectively coupling comprises a first switch for selectively coupling the output of said first means for attenuating between the single combined output and one end of a resistor whose other end is coupled to AC ground, and a second switch for selectively coupling the output of said second means for attenuating to the single combined output.

8. A method for combining an electrical and an optical channel in an oscilloscope comprising:

(a) encoding the setting of an input selector switch to form a first digital signal;
(b) attenuating an electrical input by a first selectable attenuation factor to form a first output signal;
(c) decoding the first digital signal to form second and third digital signals;
(d) directing a photocurrent, through a transimpedance amplifier having a plurality of gain modes selectable by the second digital signal to develop an electrical signal;
(e) attenuating the electrical signal from the transimpedance amplifier by a second attenuation factor to form a second output signal, the value of the second attenuation factor being determined by the third digital signal; and
(f) selectively coupling the first and second output signals to an output terminal.

* * * * *